(12) United States Patent
Ko et al.

(10) Patent No.: US 11,594,499 B2
(45) Date of Patent: Feb. 28, 2023

(54) SEMICONDUCTOR PACKAGE

(71) Applicant: Samsung Electronics Co., Ltd., Suwon-si (KR)

(72) Inventors: Yeongkwon Ko, Hwaseong-si (KR); Un-Byoung Kang, Hwaseong-si (KR); Jaekyung Yoo, Seoul (KR); Teak Hoon Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 10 days.

(21) Appl. No.: 17/203,007

(22) Filed: Mar. 16, 2021

(65) Prior Publication Data
US 2022/0020701 A1    Jan. 20, 2022

(30) Foreign Application Priority Data
Jul. 14, 2020  (KR) .................. 10-2020-0086641

(51) Int. Cl.
| | |
|---|---|
| *H01L 25/10* | (2006.01) |
| *H01L 23/00* | (2006.01) |
| *H01L 23/31* | (2006.01) |
| *H01L 23/498* | (2006.01) |
| *H01L 25/065* | (2023.01) |
| *H01L 23/13* | (2006.01) |

(52) U.S. Cl.
CPC ............ *H01L 23/562* (2013.01); *H01L 23/13* (2013.01); *H01L 23/3128* (2013.01); *H01L 23/3135* (2013.01); *H01L 23/49827* (2013.01); *H01L 23/49838* (2013.01); *H01L 24/16* (2013.01); *H01L 25/0652* (2013.01); *H01L 2224/16227* (2013.01); *H01L 2225/06513* (2013.01); *H01L 2225/06517* (2013.01); *H01L 2225/06541* (2013.01); *H01L 2225/06548* (2013.01); *H01L 2225/06586* (2013.01); *H01L 2225/06589* (2013.01); *H01L 2924/18161* (2013.01); *H01L 2924/3512* (2013.01)

(58) Field of Classification Search
None
See application file for complete search history.

(56) References Cited

U.S. PATENT DOCUMENTS

| | | |
|---|---|---|
| 5,119,171 A | 6/1992 | Lesk et al. |
| 6,902,990 B2 | 6/2005 | Gottfried et al. |
| 7,754,582 B2 | 7/2010 | Morikazu et al. |
| 7,776,720 B2 | 8/2010 | Boyle et al. |

(Continued)

FOREIGN PATENT DOCUMENTS

| | | |
|---|---|---|
| CN | 1938837 A | 3/2007 |
| KR | 20210135128 A | 11/2021 |

*Primary Examiner* — Long Pham
(74) *Attorney, Agent, or Firm* — Harness, Dickey & Pierce, P.L.C.

(57) ABSTRACT

A semiconductor package including a package substrate, a connection substrate on the package substrate and having on a lower corner of the connection substrate a recession that faces a top surface of the package substrate, a semiconductor chip on the connection substrate, a plurality of first connection terminals connecting the connection substrate to the semiconductor chip, and a plurality of second connection terminals connecting the package substrate to the connection substrate. The recession is laterally spaced apart from the second connection terminals.

20 Claims, 12 Drawing Sheets

(56) References Cited

U.S. PATENT DOCUMENTS

| | | |
|---|---|---|
| 7,843,042 B2 | 11/2010 | Kuan et al. |
| 10,304,817 B2 | 5/2019 | Lin et al. |
| 2005/0009235 A1 | 1/2005 | Swenson et al. |
| 2020/0219860 A1* | 7/2020 | Im .................. H01L 25/105 |
| 2021/0343613 A1 | 11/2021 | Ko et al. |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0086641 filed on Jul. 14, 2020 in the Korean Intellectual Property Office, the disclosure of which is hereby incorporated by reference in its entirety.

BACKGROUND

The present inventive concepts relate to a semiconductor package and/or a method of fabricating the same, and more particularly, to a semiconductor package with increased reliability.

Portable devices have been increasingly demanded in recent electronic product markets, where much portability may be achieved through a reduction in size and weight of electronic parts mounted on the portable devices. To accomplish the reduction in size and weight of the electronic parts, there is a desire for technology not only to reduce each size of mounting parts, but to integrate a number of individual devices on a single package using, for example, a chip-on-wafer (CoW) multi-chip packaging, in which multiple dies are incorporated side-by-side on a silicon interposer to achieve better interconnect density. However, in fabricating such CoW structures, the interposer may experience stresses that lead to cracks on, for example, an under-fill layer.

SUMMARY

Some example embodiments of the present inventive concepts provide a semiconductor package with increased reliability.

An object of the present inventive concepts is not limited to the mentioned above, and other objects which have not been mentioned above will be clearly understood to those skilled in the art from the following description.

According to some example embodiments of the present inventive concepts, a semiconductor package may include: a package substrate; a connection substrate on the package substrate, the connection substrate having a recession on a lower corner of the connection substrate, the recession facing a top surface of the package substrate; a semiconductor chip on the connection substrate; and a plurality of connection terminals connecting the package substrate to the connection substrate such that the recession is laterally spaced apart from the plurality of connection terminals.

According to some example embodiments of the present inventive concepts, a semiconductor package may include: a package substrate; a connection substrate on the package substrate, the connection substrate including a base substrate, a plurality of upper pads on a top surface of the base substrate, a plurality of lower pads on a bottom surface of the base substrate, and a plurality of through vias penetrating the base substrate and connecting the upper pads to the lower pads, the connection substrate including a recession on a lower corner thereof such that a width of the recession is greater than a distance between a sidewall of the connection substrate and an outermost one of the upper pads; a chip stack on the connection substrate, the chip stack including a plurality of first semiconductor chips that are vertically stacked; a second semiconductor chip spaced apart from the chip stack on the connection substrate; a plurality of first connection terminals connecting the connection substrate to the chip stack and connecting the connection substrate to the second semiconductor chip; a first under-fill layer filling a gap between the chip stack and the connection substrate and a gap between the second semiconductor chip and the connection substrate; a molding layer on the connection substrate, the molding layer covering the chip stack and the second semiconductor chip; a plurality of second connection terminals connecting the package substrate to the connection substrate; a second under-fill layer filling a gap between the package substrate and the connection substrate; and a heat radiation structure on the package substrate, the heat radiation structure covering the connection substrate, the chip stack, and the second semiconductor chip.

Details of other example embodiments are included in the description and drawings.

DETAILED DESCRIPTION

The following will now describe a semiconductor package and a method of fabricating the same according to some example embodiments of the present inventive concepts in conjunction with the accompanying drawings.

Figure 1:
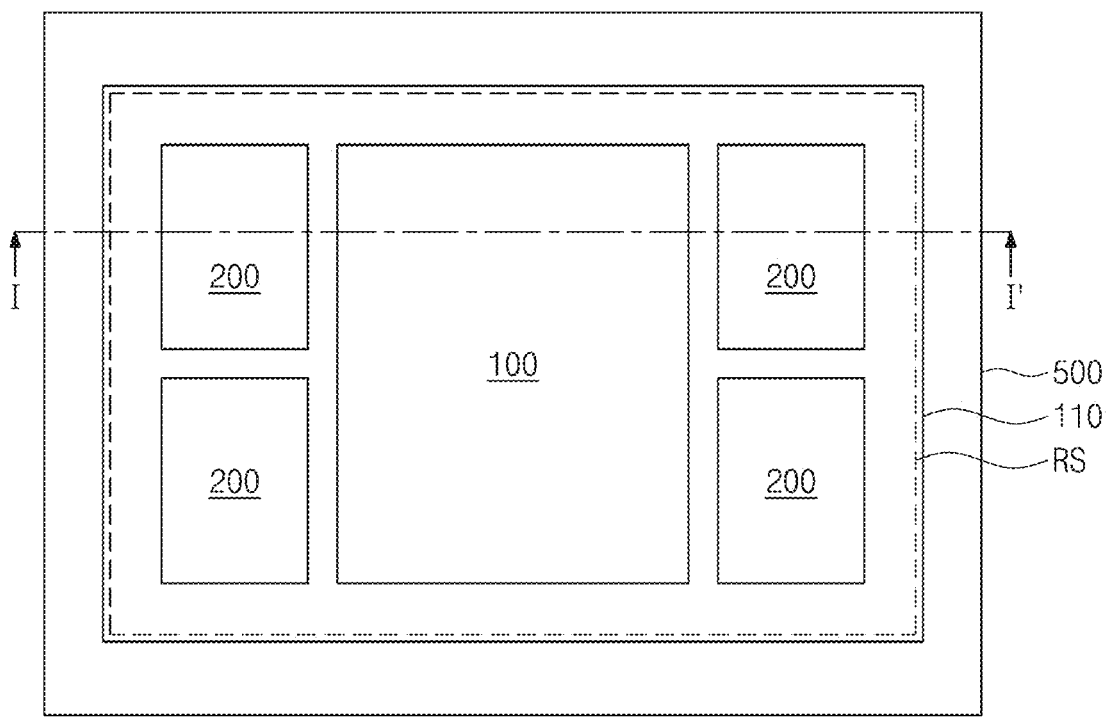
FIG. 1 illustrates a simplified plan view showing a semiconductor package according to some example embodiments of the present inventive concepts.
Figure 2:
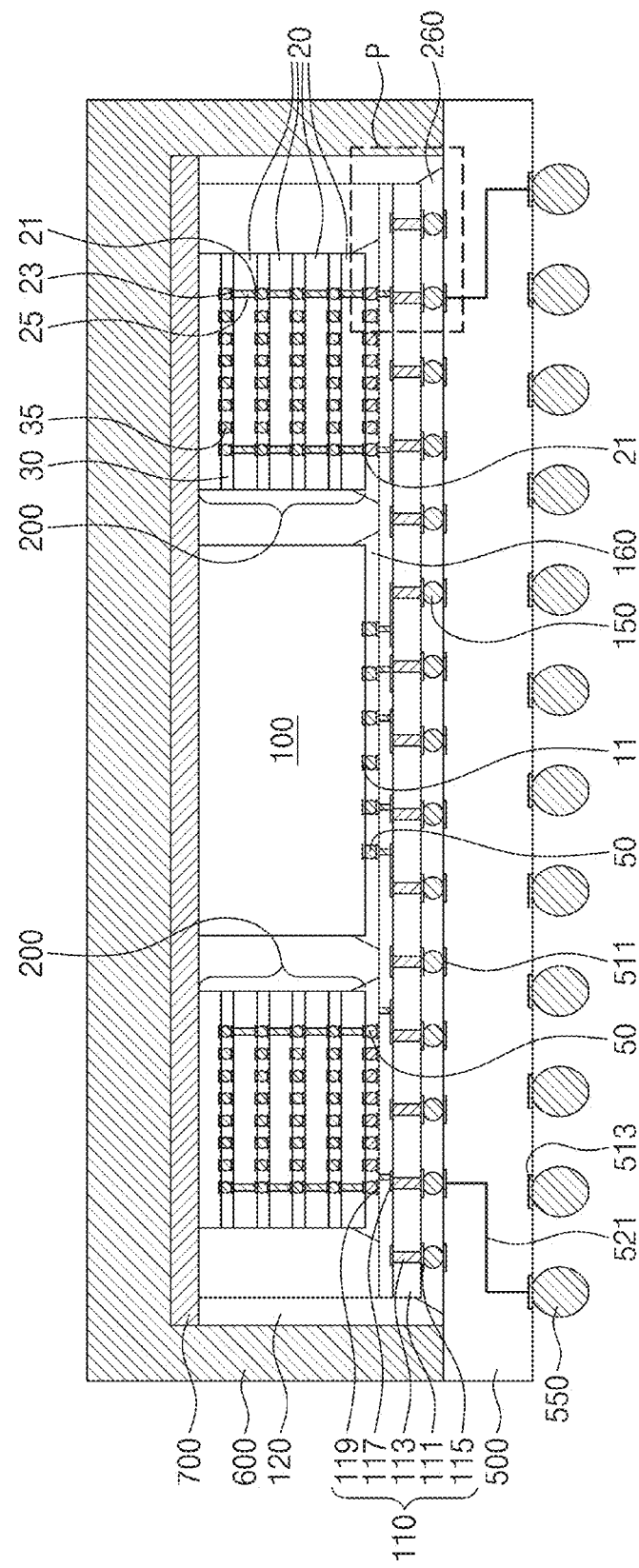
FIG. 2 illustrates a cross-sectional view taken along line I-I' of FIG. 1, showing a semiconductor package according to some example embodiments of the present inventive concepts.

FIG. 1 illustrates a simplified plan view showing a semiconductor package according to some example embodiments of the present inventive concepts. FIG. 2 illustrates a cross-sectional view taken along line I-I' of FIG. 1, showing a semiconductor package according to some example embodiments of the present inventive concepts. FIGS. 3, 4, 5, and 6 illustrate enlarged views showing section P of FIG. 2.

Referring to FIGS. 1 and 2, a semiconductor package may include a first semiconductor chip 100, second semiconductor chips 200, a connection substrate 110, a package substrate 500, and a heat radiation structure 600.

The first and second semiconductor chips 100 and 200 may be disposed on a top surface of the connection substrate 110. The first and second semiconductor chips 100 and 200 may be connected through first connection terminals 50 to the connection substrate 110.

The first semiconductor chip 100 may have chip pads 11 on a bottom surface thereof, and each of the second semiconductor chips 200 may include chip pads 21 on a bottom surface thereof. The first connection terminals 50 may be attached to the chip pads 11 and 21 of the first and second semiconductor chips 100 and 200. The first connection terminals 50 may be one or more of solder balls, conductive bumps, and conductive pillars. The first connection terminals 50 may include one or more of copper, tin, and lead. The first connection terminals 50 may have their thickness of, for example, about 30 μm to about 70 μm.

The first semiconductor chip 100 may be a logic chip including a processor, such as a microelectromechanical system (MEMS) device, an optoelectronic device, a central processing unit (CPU), a graphic processing unit (GPU), a mobile application, or a digital signal processor (DSP). The first semiconductor chip 100 may have a thickness ranging from about 700 μm to about 775 μm.

The second semiconductor chips 200 may be spaced apart from the first semiconductor chip 100 and disposed on the connection substrate 110. Each of the second semiconductor chips 200 may include a plurality of memory chips 20 that are vertically stacked. The plurality of memory chips 20 may be electrically connected to each other through the chip pads 21, chip through vias 25, and connection bumps 35. The memory chips 20 may be stacked on the connection substrate 110 so as to allow their sidewalls to align with each other. An adhesive layer 30 may be provided between the memory chips 20. The adhesive layer 30 may be, for example, a polymer tape including a dielectric material. The adhesive layer 30 may be interposed between the connection bumps 35, and thus an electrical short may be inhibited (or, alternatively, prevented) between the connection bumps 35.

The connection substrate 110 may be provided thereon with a molding layer 120 that covers the first and second semiconductor chips 100 and 200. The molding layer 120 may have a sidewall aligned with that of the connection substrate 110. The molding layer 120 may have a top surface substantially coplanar with those of the first and second semiconductor chips 100 and 200. The molding layer 120 may include a dielectric polymer, such as an epoxy molding compound (EMC).

A first under-fill layer 160 may be interposed between the first semiconductor chip 100 and the connection substrate 110 and between the second semiconductor chips 200 and the connection substrate 110. The first under-fill layer 160 may fill gaps between the first connection terminals 50. The first under-fill layer 160 may include, for example, a thermo-curable resin or a photo-curable resin. The first under-fill layer 160 may further include an inorganic filler or an organic filler. In some example embodiments, the first under-fill layer 160 may be omitted, and instead the molding layer 120 may fill gaps between the connection substrate 110 and the bottom surfaces of the first and second semiconductor chips 100 and 200.

The connection substrate 110 may be disposed on the package substrate 500 and connected through second connection terminals 150 to the package substrate 500. The connection substrate 110 may include a chip region and an edge region around the chip region. The first and second semiconductor chips 100 and 200 may be disposed on the chip region of the connection substrate 110.

Figure 3:
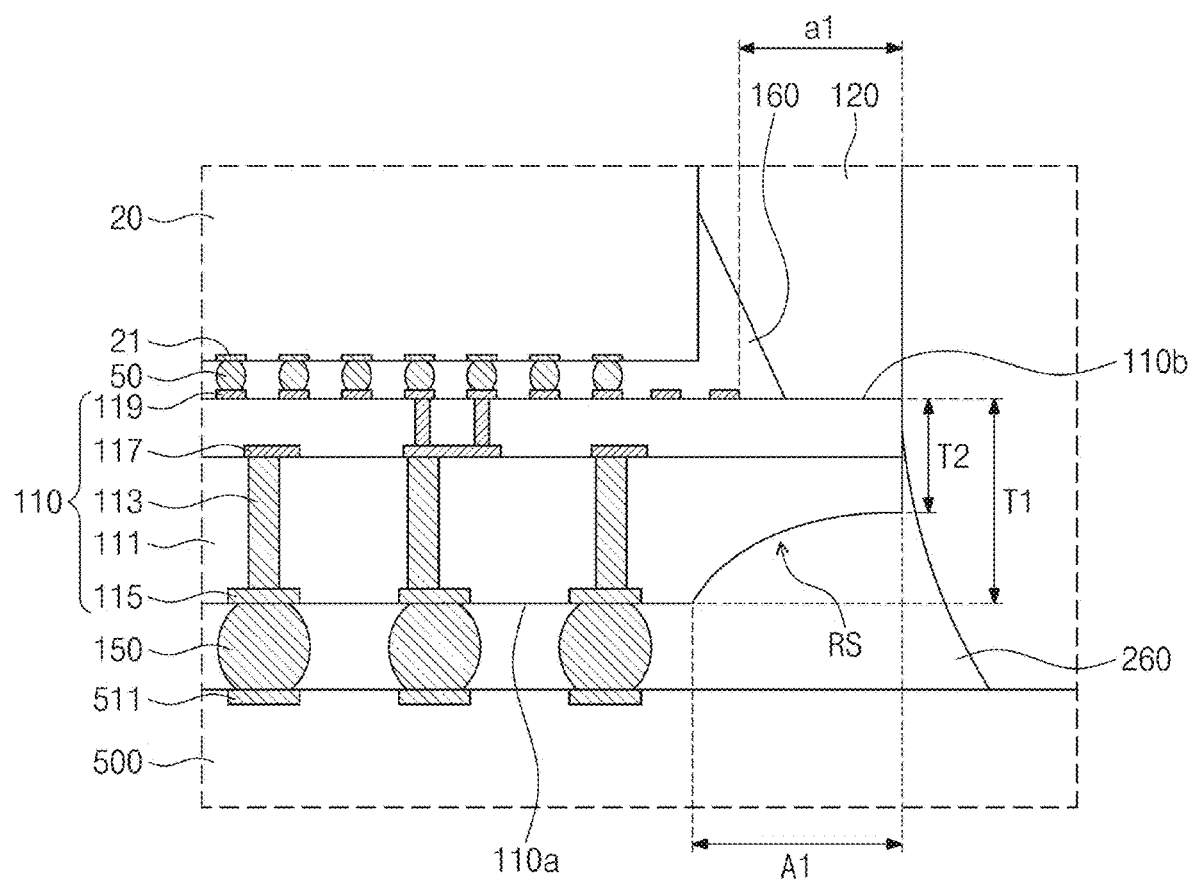
FIGS. 3, 4, 5, and 6 illustrate enlarged views showing section P of FIG. 2.

For example, referring to FIGS. 2 and 3, the connection substrate 110 may include a base substrate 111, through vias 113, a redistribution layer including connection lines 117, and lower and upper pads 115 and 119, respectively.

The base substrate 111 may be a silicon substrate or a silicon-on-insulator (SOI) substrate. Alternatively, the base substrate 111 may be a glass substrate, a ceramic substrate, a polymer substrate, or any suitable substrate that can provide proper protection and/or an interconnection function. The base substrate 111 may include active electronic devices and/or passive electronic devices. A passivation dielectric layer may be disposed on each of top and bottom surfaces of the base substrate 111.

The through vias 113 may penetrate the base substrate 111, and the through vias 113 and the connection lines 117 may include a metallic material, such as tungsten (W), aluminum (Al), or copper (Cu).

The lower pads 115 may be disposed on a bottom surface 110a of the connection substrate 110, and the upper pads 119 may be disposed on a top surface 110b of the connection substrate 110. The lower pads 115 may be electrically connected to the upper pads 119 through the connection lines 117 and the through vias 113.

The second connection terminals 150 may be attached to the lower pads 115 of the connection substrate 110. The second connection terminals 150 may be electrically connected to the upper pads 119 through the lower pads 115, the through vias 113, and the connection lines 117. The second connection terminals 150 may be solder balls formed of tin, lead, and/or copper. The second connection terminals 150 may have their thickness of about 40 μm to about 80 μm.

Referring to FIGS. 2 and 3, the connection substrate 110 may have a recession RS on a lower corner thereof. For example, the recession RS may be formed on a lower corner of the base substrate 111 and may face the package substrate 500. The connection substrate 110 may have a thickness T1 of about 100 μm to about 110 μm on the chip region thereof and a minimum thickness T2 of about 30 μm to about 50 μm on the sidewall thereof.

The recession RS may be laterally spaced apart from the second connection terminals 150. The recession RS may vertically overlap at least one of the upper pads 119 of the connection substrate 110. The connection substrate 110 may have first and second sidewalls that face each other, and the recessions RS formed on the first and second sidewalls may be mirror-symmetrical with each other.

As shown in FIG. 3, the recession RS may have a rounded surface, and when viewed from the bottom surface 110a of the connection substrate 110, a depth of the recession RS may decrease as departing from the sidewall of the connection substrate 110. When viewed from the bottom surface 110a of the connection substrate 110, the recession RS may have a maximum depth of about 70 μm to about 90 μm.

The recession RS may have a width A1 greater than a distance a1 between the sidewall of the connection substrate 110 and an outermost upper pad 119 of the connection substrate 110. For example, the width A1 of the recession RS may range from about 100 μm to about 120 μm.

Figure 4:
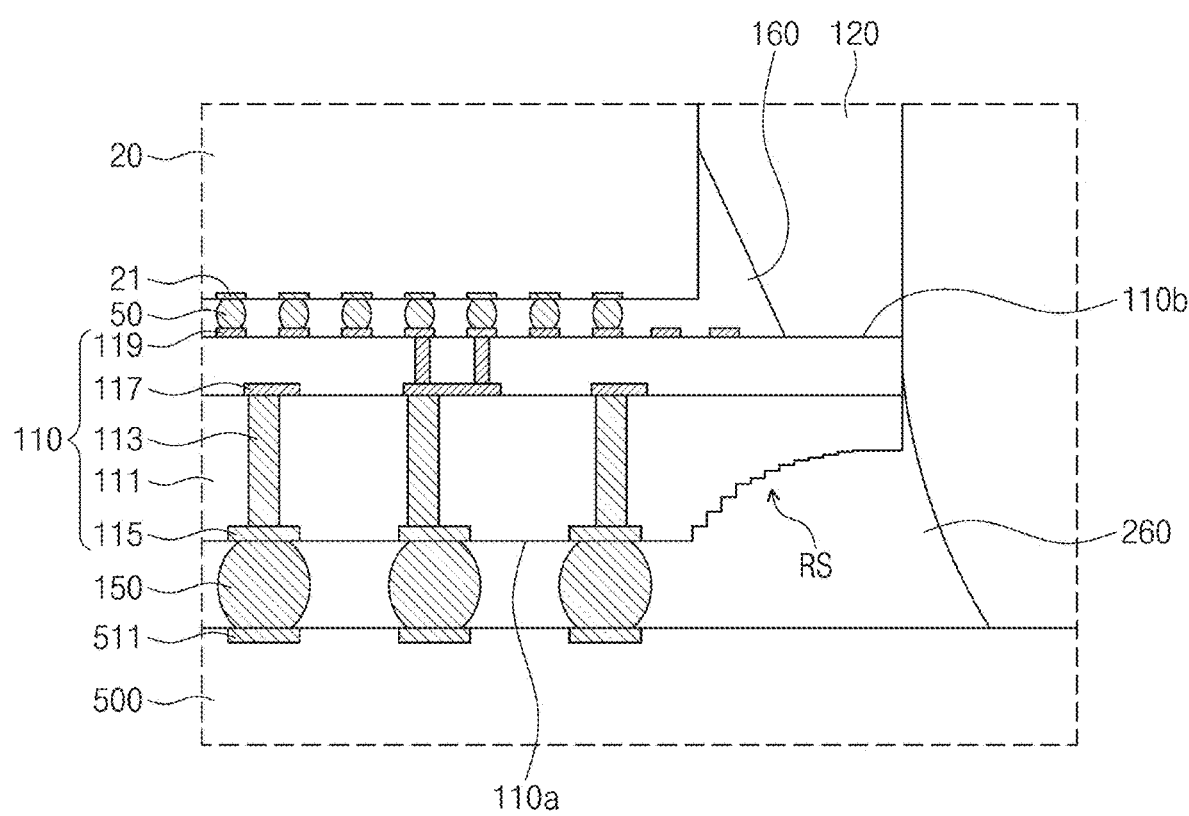
Figure 5:
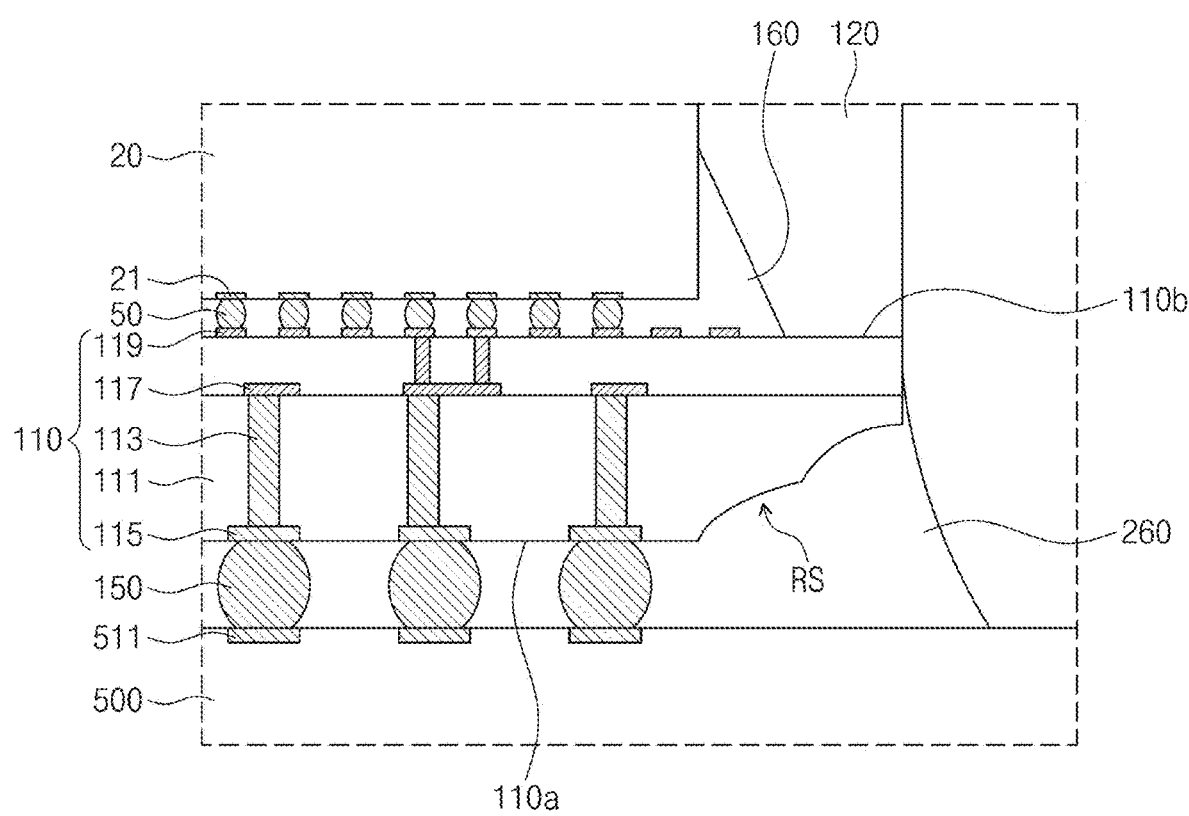
Figure 6:
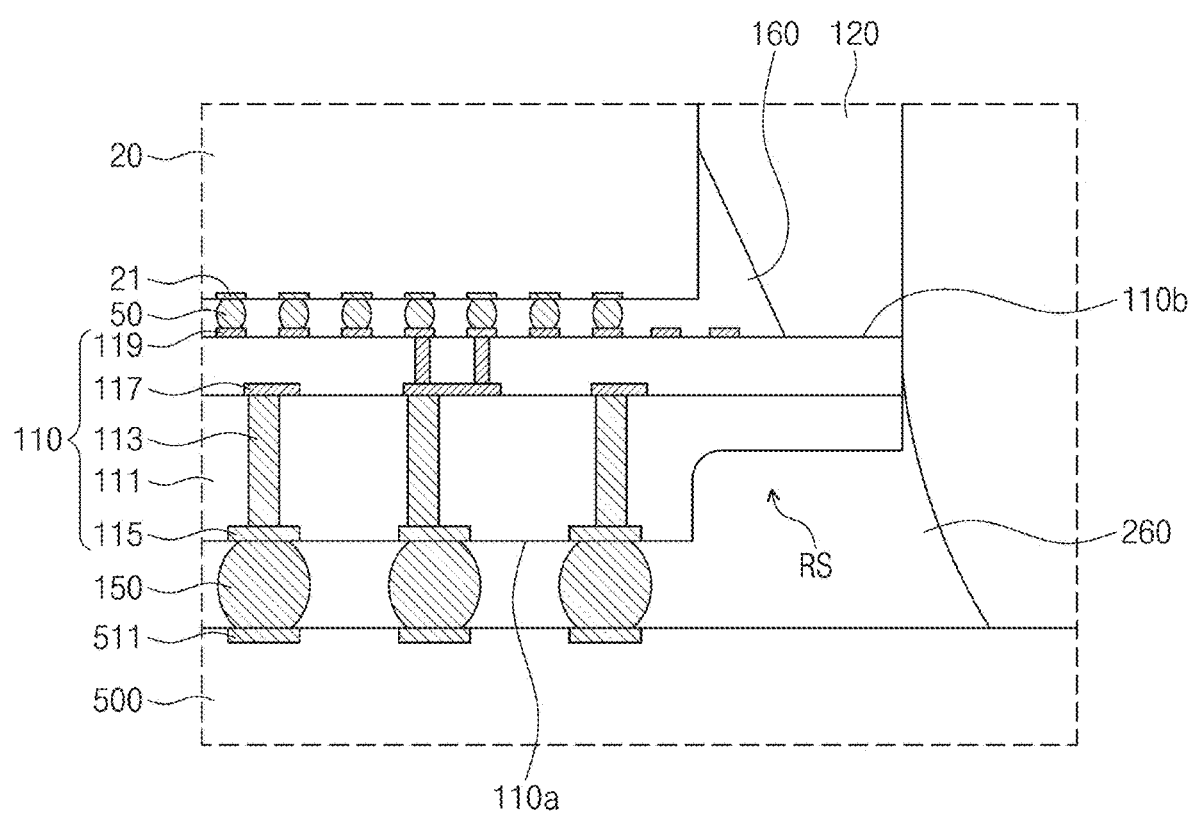

In some example embodiments, referring to FIG. 4, the recession RS may have a stepwise surface. In some example embodiments, referring to FIG. 5, the recession RS may have a discontinuous surface. For example, the recession RS may have a first curved surface and a second curved surface that have different radius curvatures from each other. In some example embodiments, referring to FIG. 6, the connection substrate 110 may have a first part with a first thickness and a second part with a second thickness, and the recession RS of the connection substrate 110 may be defined by the first part and the second part.

The connection substrate 110 and the package substrate 500 may have therebetween a second under-fill layer 260 that fills gaps between the second connection terminals 150. The second under-fill layer 260 may fill the recession RS of the connection substrate 110 and may partially cover the sidewall of the connection substrate 110. The second under-fill layer 260 may be in direct contact with a surface of the recession RS. The second under-fill layer 260 may include, for example, a thermo-curable resin or a photo-curable resin. The second under-fill layer 260 may further include an inorganic filler or an organic filler.

The package substrate 500 may be, for example, a printed circuit board, a flexible substrate, or a tape substrate. For example, the package substrate 500 may be one of a flexible printed circuit board, a rigid printed circuit board, and a combination thereof, each of which boards includes internal lines 521 formed therein.

The package substrate 500 may have a top surface and a bottom surface that face each other, and may include upper coupling pads 511, external coupling pads 513, and internal lines 521. The upper coupling pads 511 may be arranged on the top surface of the package substrate 500, and the external coupling pads 513 may be arranged on the bottom surface of the package substrate 500. The upper coupling pads 511 may be electrically connected through the internal lines 521 to the external coupling pads 513. External coupling terminals 550 may be attached to the external coupling pads 513. A ball grid array (BGA) may be provided as the external coupling terminals 550.

The heat radiation structure 600 may include a thermal conductive material. The thermal conductive material may include a metallic material (e.g., copper and/or aluminum) or a carbon-containing material (e.g., graphene, graphite, and/or carbon nano-tube). The heat radiation structure 600 may have relatively high thermal conductivity. For example, a single metal layer or a plurality of stacked metal layers may be used as the heat radiation structure 600. For another example, the heat radiation structure 600 may include a heat sink or a heat pipe. For another example, the heat radiation structure 600 may be configured to use water cooling.

A thermal conductive layer 700 may be interposed between the semiconductor package and the heat radiation structure 600. The thermal conductive layer 700 may be in contact with a top surface of the semiconductor package and a bottom surface of the heat radiation structure 600. The thermal conductive layer 700 may include a thermal interface material (TIM). The thermal interface material may include, for example, a polymer and thermal conductive particles. The thermal conductive particles may be distributed in the polymer. When the semiconductor package operates, heat produced from the semiconductor package may be transferred through the thermal conductive layer 700 to the heat radiation structure 600.

FIGS. 7 to 12 illustrate cross-sectional views showing a method of fabricating a semiconductor package according to some example embodiments of the present inventive concepts.

Figure 7:
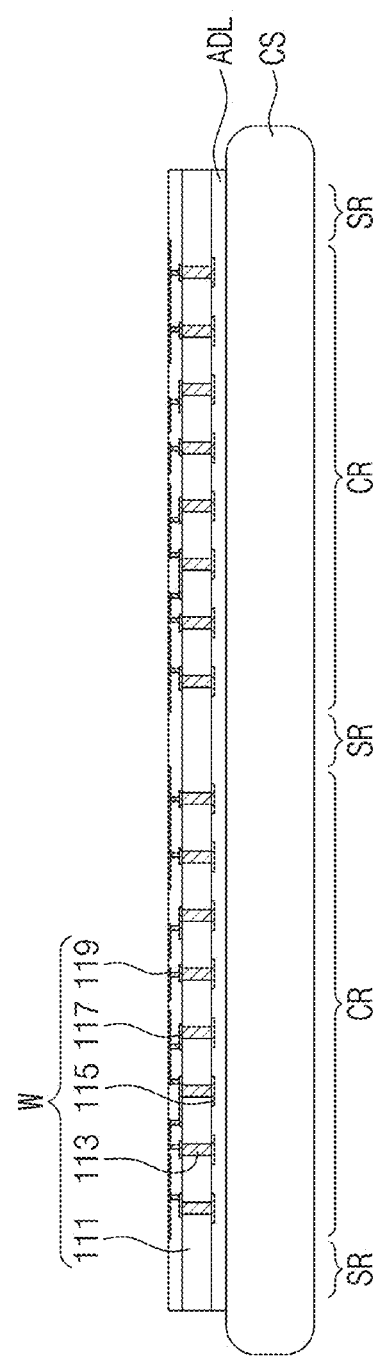
FIGS. 7 to 12 illustrate cross-sectional views showing a method of fabricating a semiconductor package according to some example embodiments of the present inventive concepts.

Referring to FIG. 7, a substrate W may be provided on a carrier substrate CS. An adhesive layer ADL may be used to attach the substrate W onto the carrier substrate CS.

The substrate W may include chip regions CR and a scribe line region SR that surrounds each of the chip regions CR. The chip regions CR may be two-dimensionally arranged along rows and columns.

The substrate W may include a base substrate 111, through vias 113, a redistribution layer including connection lines 117, and lower and upper pads 115 and 119. The lower pads 115 may be formed on a bottom surface of the substrate W, and the redistribution layer may be formed on a top surface of the substrate W. The redistribution layer may include the connection lines 117 that connect the upper pads 119 to the through vias 113. The lower pads 115 may be electrically connected to the upper pads 119 through the connection lines 117 and the through vias 113.

The adhesive layer ADL may be provided between the substrate W and the carrier substrate CS, and may protect the lower pads 115.

Figure 8:
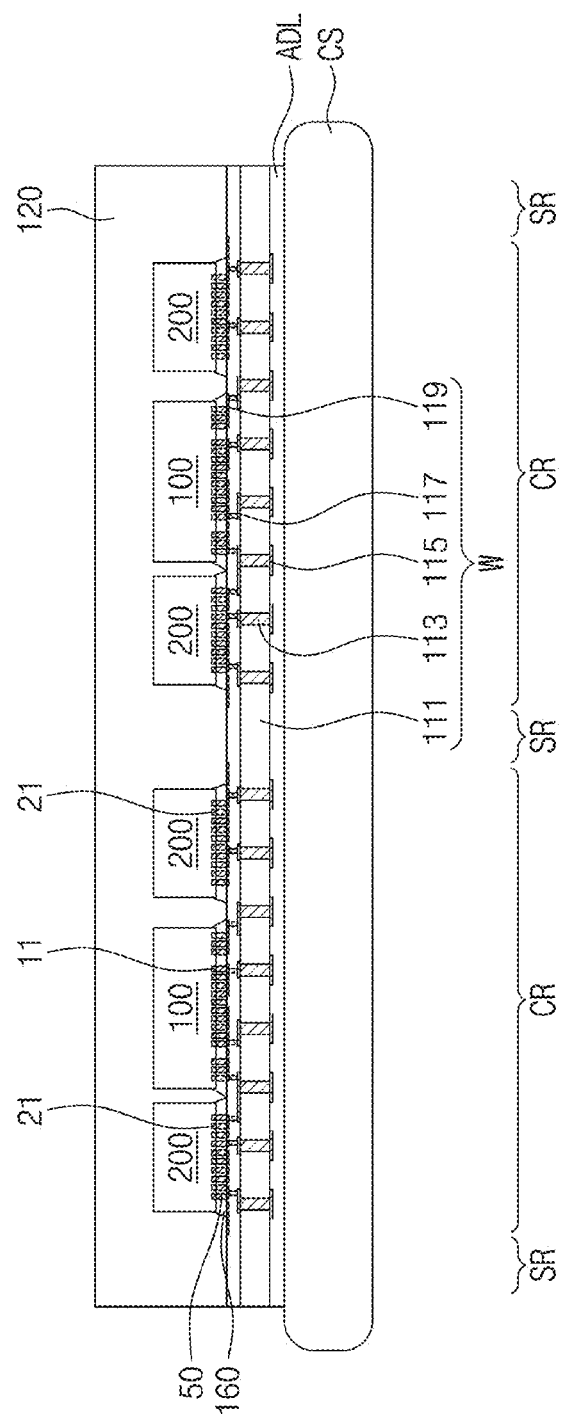

Referring to FIG. 8, a first semiconductor chip 100 and a plurality of second semiconductor chips 200 may be attached onto each chip region CR of the substrate W.

For example, the first semiconductor chip 100 may include chip pads 11 on a bottom surface thereof, and each of the second semiconductor chips 200 may include chip pads 21 on a bottom surface thereof. The first and second semiconductor chips 100 and 200 may be disposed to allow their chip pads 11 and 21 to face the top surface of the substrate W. The chip pads 11 and 21 of the first and second semiconductor chips 100 and 200 may be connected through first connection terminals 50 to the upper pads 119 of the substrate W.

After the attachment of the first and second semiconductor chips 100 and 200, a first under-fill layer 160 may fill gaps between the first connection terminals 50 on each of the chip regions CR.

Afterwards, a molding layer 120 may be formed on the substrate W, covering top surfaces of the first and second semiconductor chips 100 and 200. The molding layer 120 may be thicker than the first and second semiconductor chips 100 and 200, and may fill gaps between the first and second semiconductor chips 100 and 200. The molding layer 120 may include a dielectric polymer, such as an epoxy molding compound (EMC).

Figure 9:
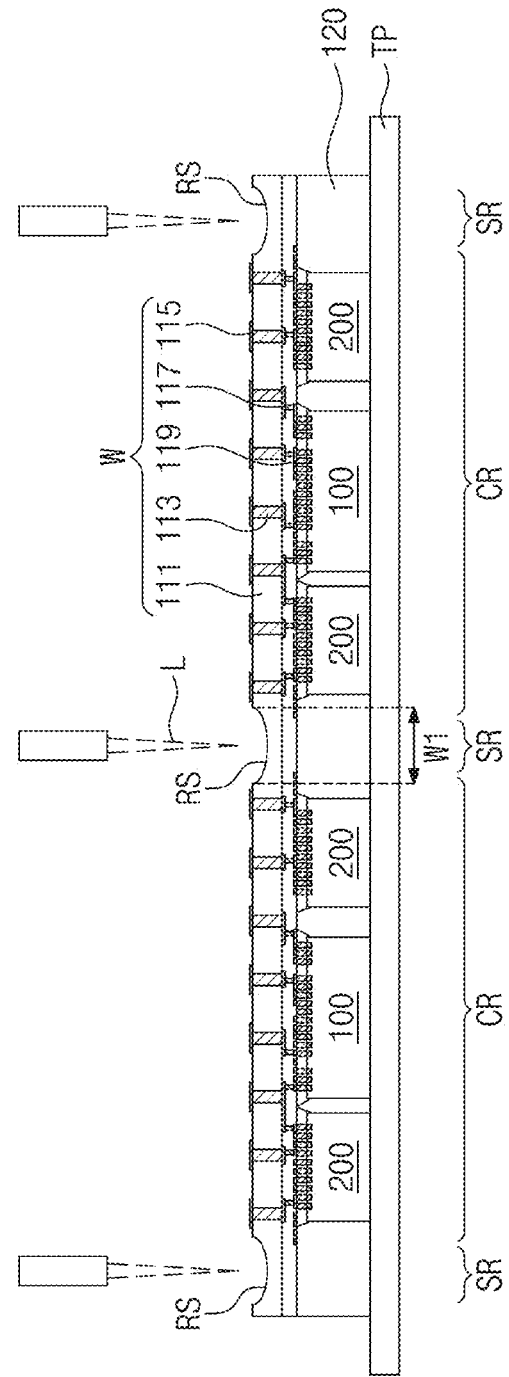

Referring to FIG. 9, after the formation of the molding layer 120, a thinning process may be performed on the molding layer 120. The thinning process may include a grinding process, a chemical mechanical polishing process, or an etching process. After the thinning process, a top surface of the molding layer 120 may be located at substantially the same level as that of the top surfaces of the first and second semiconductor chips 100 and 200.

After the thinning process performed on the molding layer 120, a support tape TP may be attached to the top surfaces of the molding layer 120 and the first and second semiconductor chips 100 and 200. In addition, the adhesive layer ADL may be removed from the bottom surface of the substrate W.

On the bottom surface of the substrate W, a laser grooving process may be performed along the scribe line region SR. The laser grooving process may include forming a recession RS on the bottom surface of the substrate W by allowing the scribe line region SR to receive a stealth laser L that passes through the substrate W. For example, the recession RS may be formed to have a rounded bottom surface due to the laser grooving process. The recession RS may have a surface that depends on a width and/or intensity of a laser beam used in the laser grooving process. The stealth laser L may be irradiated in a linear or zigzag fashion along the scribe line region SR. The stealth laser L may have a wavelength ranging from about 900 nm to about 1,700 nm, but the present inventive concepts are not limited thereto.

It is described by way of example that the laser grooving process is performed to form the recession RS, but the present inventive concepts are not limited thereto and the recession RS may be formed by a blade sawing process, a wet etching process, or a dry etching process.

The recession RS may be formed on the scribe line region SR and an edge of the chip region CR. The recession RS may be laterally spaced apart from the lower pads 115 on the bottom surface of the substrate W. The recession RS may vertically overlap at least one of the upper pads 119 formed on the top surface of the substrate W.

The recession RS may have a width W1 greater than that of the scribe line region SR. For example, the width W1 of the recession RS may range from about 220 μm to about 240 μm. The recession RS may have a depth that decreases as departing from the scribe line region SR. For example, the depth of the recession RS may range from about 70 μm to about 90 μm.

Figure 10:
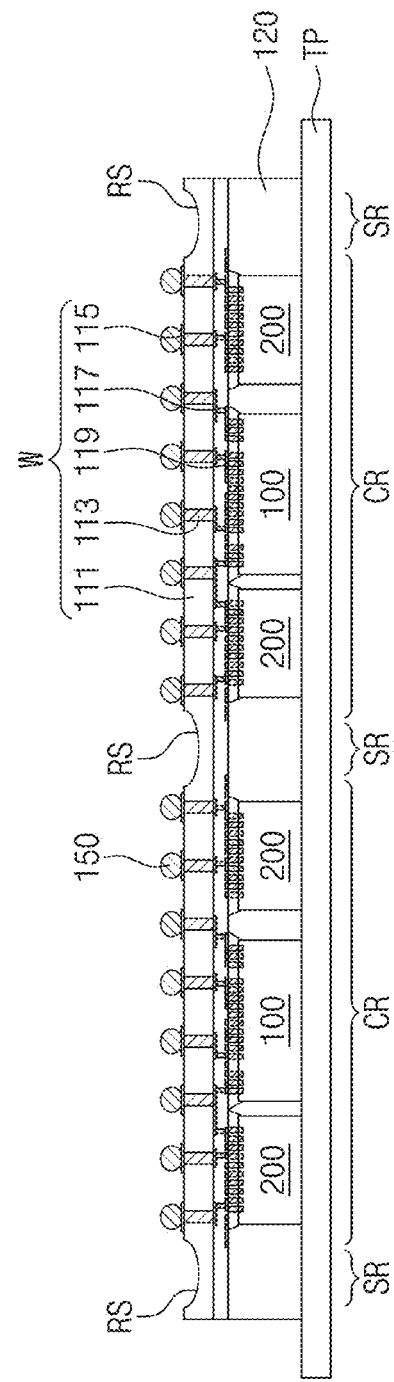

Referring to FIG. 10, second connection terminals 150 may be attached to the lower pads 115 of the substrate W, and the second connection terminals 150 may be electrically connected to the upper pads 119 through the connection lines 117 and the through vias 113. The second connection terminals 150 may be solder balls formed of tin, lead, and/or copper.

Figure 11:
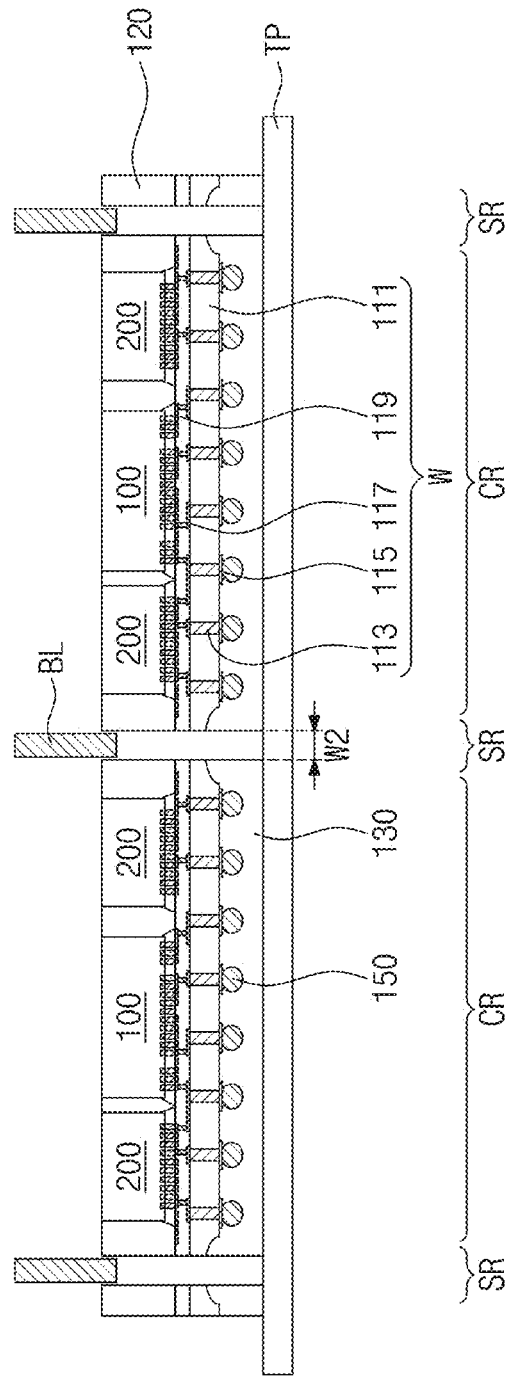

Referring to FIG. 11, the substrate W may be provided on its bottom surface with an adhesive mold layer 130 that covers the second connection terminals 150, and a sawing tape TP may be attached onto the adhesive mold layer 130.

A sawing process may be performed along the scribe line region SR, thereby separating the chip regions CR from each other. The sawing process may include using a blade BL or laser to cut the substrate W. The chip regions CR of the substrate W may be separated into a plurality of semiconductor chips on the sawing tape TP. During the sawing process, a cutting width W2 may be less than the width W1 of the recession RS. For example, the cutting width W2 of the sawing process may range from about 30 μm to about 40 μm.

It is illustrated by way of example that the sawing tape TP is attached onto the adhesive mold layer 130, and that the sawing process starts from the molding layer 120, but the present inventive concepts are not limited thereto and the sawing process may be performed starting from the adhesive mold layer 130.

Figure 12:
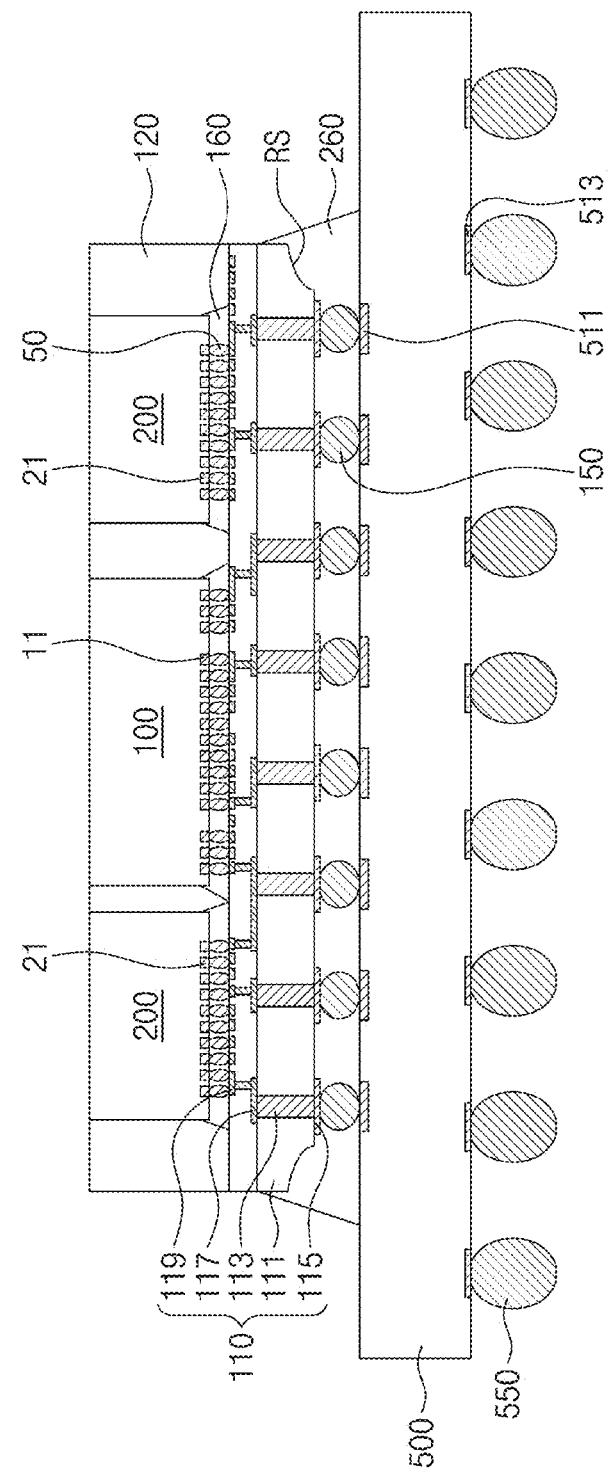

Referring to FIG. 12, the separated semiconductor chip may be attached onto a package substrate 500.

The package substrate 500 may have a top surface and a bottom surface that face each other, and may include upper coupling pads 511, external coupling pads 513, and internal lines 521.

The second connection terminals 150 may be attached between the upper coupling pads 511 of the package substrate 500 and the lower pads 115 of the connection substrate 110. External coupling terminals 550 may be attached to the external coupling pads 513. A ball grid array (BGA) may be provided as the external coupling terminals 550.

After the attachment of the semiconductor chip, a second under-fill layer 260 may fill gaps between the connection substrate 110 and the package substrate 500. According to some example embodiments, because the connection substrate 110 has the recession RS on a lower corner thereof, when the second under-fill layer 260 is formed, the second under-fill layer 260 may be inhibited (or, alternatively, prevented) from being cracked due to stress concentrated on the lower corner of the connection substrate 110.

In addition, because the recession RS is formed on the lower corner of the connection substrate 110, a volume of the second under-fill layer 260 may become increased below the connection substrate 110 such that the second under-fill layer 260 may be reduced or prevented from protruding outwardly from a sidewall of the connection substrate 110.

Referring to FIG. 2, after the formation of the second under-fill layer 260, a thermal conductive layer 700 and a heat radiation structure 600 may be formed.

According to some example embodiments of the present inventive concepts, because a connection substrate has a recession on a lower corner thereof, an under-fill layer may be inhibited (or, alternatively, prevented) from being cracked due to stress concentrated on the lower corner of the connection substrate.

Moreover, because the recession is formed on the lower corner of the connection substrate, a volume of the under-fill layer is increased below the connection substrate such that the under-fill layer may be reduced or prevented from protruding outwardly from a sidewall of the connection substrate.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
    a package substrate;
    a connection substrate on the package substrate, the connection substrate including a top surface, a bottom surface and a pair of side walls extending between the top surface and the bottom surface, the connection substrate having a recession on a lower corner of at least one of the pair of side walls, the recession facing a top surface of the package substrate;
    a semiconductor chip on the connection substrate; and
    a plurality of connection terminals connecting the package substrate to the connection substrate such that the recession is laterally spaced apart from the plurality of connection terminals and relatively closer than the plurality of connection terminals to the at least one of the pair of side walls.

2. The semiconductor package of claim 1, wherein
    the connection substrate includes a plurality of upper pads on a top surface of the connection substrate and a plurality of lower pads on a bottom surface of the connection substrate, the upper pads connected to the semiconductor chip, and the lower pads connected to the package substrate, and
    a width of the recession is greater than a distance between a sidewall of the connection substrate and an outermost one of the upper pads.

3. The semiconductor package of claim 2, wherein the recession vertically overlaps at least one of the upper pads.

4. The semiconductor package of claim 1, wherein a width of the recession is in a range of about 100 μm to about 120 μm.

5. The semiconductor package of claim 1, wherein the connection substrate includes a chip region and an edge region around the chip region, a sidewall of the connection substrate having a first thickness, and the chip region of the connection substrate having a second thickness, the second thickness being greater than the first thickness.

6. The semiconductor package of claim 1, wherein a depth of the recession from a bottom surface of the connection substrate gradually decreases towards the semiconductor chip from a sidewall of the connection substrate.

7. The semiconductor package of claim 1, wherein a maximum depth of the recession is in a range of about 70 μm to about 90 μm from a bottom surface of the connection substrate.

8. The semiconductor package of claim 1, wherein the recession has a rounded surface.

9. The semiconductor package of claim 1, wherein the recession has a stepwise surface.

10. The semiconductor package of claim 1, further comprising:
a plurality of first connection terminals connecting the connection substrate to the semiconductor chip;
a first under-fill layer filling a gap between the first connection terminals between the semiconductor chip and the connection substrate; and
a second under-fill layer filling a gap between the connection substrate and the package substrate, the recession being in contact with the second under-fill layer.

11. The semiconductor package of claim 1, further comprising:
a molding layer on the connection substrate and covering the semiconductor chip, the molding layer having a sidewall aligned with a sidewall of the connection substrate.

12. A semiconductor package, comprising:
a package substrate;
a connection substrate on the package substrate, the connection substrate having a recession on a lower corner of the connection substrate, the recession facing a top surface of the package substrate;
a semiconductor chip on the connection substrate; and
a plurality of connection terminals connecting the package substrate to the connection substrate such that the recession is laterally spaced apart from the plurality of connection terminals, wherein
the connection substrate includes a chip region and an edge region that surrounds the chip region, the semiconductor chip being on the chip region with the recession defined along the edge region.

13. The semiconductor package of claim 1, wherein
the connection substrate has a first sidewall and a second sidewall that face each other,
the recession includes a first recession adjacent to the first sidewall and a second recession adjacent to the second sidewall, the second recession being mirror-symmetrical with the first recession.

14. A semiconductor package, comprising:
a package substrate;
a connection substrate on the package substrate, the connection substrate including a base substrate, a plurality of upper pads on a top surface of the base substrate, a plurality of lower pads on a bottom surface of the base substrate, and a plurality of through vias penetrating the base substrate and connecting the upper pads to the lower pads, the connection substrate including a recession on a lower corner thereof such that a width of the recession is greater than a distance between a sidewall of the connection substrate and an outermost one of the upper pads;
a chip stack on the connection substrate, the chip stack including a plurality of first semiconductor chips that are vertically stacked;
a second semiconductor chip spaced apart from the chip stack on the connection substrate;
a plurality of first connection terminals connecting the connection substrate to the chip stack and connecting the connection substrate to the second semiconductor chip;
a first under-fill layer filling a gap between the chip stack and the connection substrate and a gap between the second semiconductor chip and the connection substrate;
a molding layer on the connection substrate, the molding layer covering the chip stack and the second semiconductor chip;
a plurality of second connection terminals connecting the package substrate to the connection substrate;
a second under-fill layer filling a gap between the package substrate and the connection substrate; and
a heat radiation structure on the package substrate, the heat radiation structure covering the connection substrate, the chip stack, and the second semiconductor chip.

15. The semiconductor package of claim 14, wherein the recession vertically overlaps at least one of the upper pads.

16. The semiconductor package of claim 14, wherein a depth of the recession from a bottom surface of the connection substrate decreases from the sidewall of the connection substrate.

17. The semiconductor package of claim 14, wherein the recession has a rounded surface in contact with the second under-fill layer.

18. The semiconductor package of claim 14, wherein a sidewall of the molding layer is aligned with the sidewall of the connection substrate.

19. The semiconductor package of claim 14, wherein a top surface of the molding layer, a top surface of the chip stack, and a top surface of the second semiconductor chip are at substantially a same level.

20. The semiconductor package of claim 14, wherein
the width of the recession is between 100 μm to 120 μm, and
a maximum depth of the recession from a bottom surface of the connection substrate is between 70 μm to 90 μm.

* * * * *

UNITED STATES PATENT AND TRADEMARK OFFICE
CERTIFICATE OF CORRECTION

PATENT NO. : 11,594,499 B2
APPLICATION NO. : 17/203007
DATED : February 28, 2023
INVENTOR(S) : Yeongkwon Ko et al.

Page 1 of 2

It is certified that error appears in the above-identified patent and that said Letters Patent is hereby corrected as shown below:

In the Claims

Claim 2 should read:
2. The semiconductor package of claim 1, wherein
 the connection substrate includes a plurality of upper pads on the top surface of the connection substrate and a plurality of lower pads on the bottom surface of the connection substrate, the upper pads connected to the semiconductor chip, and the lower pads connected to the package substrate, and
 a width of the recession is greater than a distance between one of the pair of sidewalls of the connection substrate and an outermost one of the upper pads.

Claim 5 should read:
5. The semiconductor package of claim 1, wherein the connection substrate includes a chip region and an edge region around the chip region, one of the pair of sidewalls of the connection substrate having a first thickness, and the chip region of the connection substrate having a second thickness, the second thickness being greater than the first thickness.

Claim 6 should read:
6. The semiconductor package of claim 1, wherein a depth of the recession from the bottom surface of the connection substrate gradually decreases towards the semiconductor chip from one of the pair of sidewalls of the connection substrate.

Claim 7 should read:
7. The semiconductor package of claim 1, wherein a maximum depth of the recession is in a range of about 70 μm to about 90 μm from the bottom surface of the connection substrate.

Claim 10 should read:
10. The semiconductor package of claim 1, further comprising:
 a plurality of first connection terminals connecting the connection substrate to the semiconductor chip;

Signed and Sealed this
Twelfth Day of August, 2025

Coke Morgan Stewart
*Acting Director of the United States Patent and Trademark Office*

CERTIFICATE OF CORRECTION (continued)
U.S. Pat. No. 11,594,499 B2 a first under-fill layer filling a gap between the first connection terminals that are disposed between the semiconductor chip and the connection substrate; and
      a second under-fill layer filling a gap between the connection substrate and the package substrate, the recession being in contact with the second under-fill layer.

Claim 11 should read:
11. The semiconductor package of claim 1, further comprising:
      a molding layer on the connection substrate and covering the semiconductor chip, the molding layer having a sidewall aligned with one of the pair of sidewalls of the connection substrate.

Claim 18 should read:
18. The semiconductor package of claim 14, wherein a sidewall of the molding layer is aligned with one of the pair of sidewalls of the connection substrate.